US012715768B2

(12) United States Patent
Hirata et al.

(10) Patent No.: US 12,715,768 B2
(45) Date of Patent: Aug. 25, 2026

(54) ScAlN LAMINATE AND MANUFACTURING METHOD THEREOF

(71) Applicant: NATIONAL INSTITUTE OF ADVANCED INDUSTRIAL SCIENCE AND TECHNOLOGY, Tokyo (JP)

(72) Inventors: Kenji Hirata, Tosu (JP); Hiroshi Yamada, Tosu (JP); Masato Uehara, Tosu (JP); Sri Ayu Anggraini, Tosu (JP); Morito Akiyama, Tosu (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 357 days.

(21) Appl. No.: 18/559,376

(22) PCT Filed: Apr. 21, 2022

(86) PCT No.: PCT/JP2022/018447

§ 371 (c)(1), (2) Date: Nov. 7, 2023

(87) PCT Pub. No.: WO2022/244589

PCT Pub. Date: Nov. 24, 2022

(65) Prior Publication Data

US 2024/0228282 A1 Jul. 11, 2024

(30) Foreign Application Priority Data

May 20, 2021 (JP) ................................ 2021-085182

(51) Int. Cl.
*C01B 21/06* (2006.01)
*C23C 14/06* (2006.01)
(Continued)

(52) U.S. Cl.
CPC ...... *C01B 21/0602* (2013.01); *C23C 14/0641* (2013.01); *C23C 14/34* (2013.01);
(Continued)

(58) Field of Classification Search
None
See application file for complete search history.

(56) References Cited

U.S. PATENT DOCUMENTS

2016/0156332 A1 6/2016 Umeda
2020/0357976 A1 11/2020 Teshigahara et al.
2024/0229221 A1 * 7/2024 Lubomirsky ...... H10N 30/2042

FOREIGN PATENT DOCUMENTS

CN 111599915 A 8/2020
JP 2016-096506 A 5/2016
(Continued)

OTHER PUBLICATIONS

Priority document for US 2024/0229221: IL 283142 (Year: 2021).*
Office Action mailed Mar. 18, 2025, issued in corresponding Japanese Patent Application No. 2022-070374 and its English translation.

(Continued)

*Primary Examiner* — David Sample
(74) *Attorney, Agent, or Firm* — OSTROLENK FABER LLP

(57) ABSTRACT

This ScAlN laminate includes a substrate, an intermediate layer formed on the substrate and a ScAlN thin film formed on the intermediate layer, and a nearest neighbor distance, which is a distance between atoms closest to each other in a lattice plane parallel to a surface of the intermediate layer, is shorter than the a-axis length of the ScAlN thin film.

10 Claims, 9 Drawing Sheets

(51) Int. Cl.

| | |
|---|---|
| ***C23C 14/34*** | (2006.01) |
| ***H10N 30/00*** | (2023.01) |
| ***H10N 30/079*** | (2023.01) |
| ***H10N 30/853*** | (2023.01) |

(52) U.S. Cl.

CPC ......... *H10N 30/079* (2023.02); *H10N 30/708* (2024.05); *H10N 30/853* (2023.02); *C01P 2006/40* (2013.01)

(56) References Cited

FOREIGN PATENT DOCUMENTS

| | | | |
|---|---|---|---|
| JP | 2018-181870 | A | 11/2018 |
| JP | 2019-145677 | A | 8/2019 |
| WO | WO 2015/025716 | A1 | 2/2015 |
| WO | WO 2019/163494 | A1 | 8/2019 |
| WO | WO 2020/104562 | A1 | 5/2020 |

OTHER PUBLICATIONS

Kenji Hirata, et al. "The calculated Al—Sc—N ternary phase diagram and the solubility of Sc in strained wurtzite phase", the Japan Society of Applied Physics spring academic lecture meeting lecture proceedings (CD-ROM), Feb. 28, 2020, vol. 67, No. 14p-PB5-1, p. 07-146. See concise explanation of the relevance in the translation of the Japanese Office Action mailed Mar. 18, 2025.

Morito Akiyama et al.: "Enhancement of Piezoelectric Response in Scandium Aluminum Nitride Alloy Thin Films Prepared by Dual Reactive Cosputtering", Advanced Materials, VCH Publishers, DE, vol. 21, No. 5, Dec. 2, 2008, pp. 593-596.

Kevin R. Talley et al.: "Implications of heterostructural alloying for enhanced piezoelectric performance of (Al,Sc)N", Physical Review Materials, vol. 2, No. 6, 063802, Jun. 1, 2018.

International Search Report mailed Jul. 26, 2022 in corresponding PCT International Application No. PCT/JP2022/018447.

* cited by examiner

ScAlN LAMINATE AND MANUFACTURING METHOD THEREOF

CROSS-REFERENCE TO RELATED APPLICATIONS

The present application is a 35 U.S.C. §§ 371 national stage application of International Application No. PCT/JP2022/018447, filed Apr. 21, 2022, which claims priority to Japanese Patent Application No. 2021-085182, filed May 20, 2021, the contents of which are incorporated herein by reference.

TECHNICAL FIELD

The present invention relates to a ScAlN laminate and a manufacturing method thereof. Priority is claimed on Japanese Patent Application No. 2021-85182, filed May 20, 2021, the content of which is incorporated herein by reference.

BACKGROUND ART

AlN thin films exhibit excellent piezoelectric performance and are thus in use in a variety of devices (for example, FBAR high-frequency filters for mobile communication, piezoelectric sensors, energy harvesters, MEMS microphones and fingerprint authentication sensors).

In recent years, there has been a demand for a variety of high-performance sensors. In addition, for AlN thin films, there has been a demand for additional improvement in piezoelectric performance due to the ongoing increase in communication frequencies.

Incidentally, as disclosed in, for example, Patent Document 1, it is known that AlN thin films to which Sc has been added, that is, ScAlN thin films exhibit higher piezoelectric performance than AlN thin films.

CITATION LIST

Patent Document

[Patent Document 1]

Japanese Unexamined Patent Application, First Publication No. 2019-145677

SUMMARY OF THE INVENTION

Problems to be Solved by the Invention

It has been shown by theoretical calculation (first-principles calculation) that, as the amount of Sc added increases, ScAlN thin films exhibit higher piezoelectric performance (the piezoelectric constants become higher). Therefore, in Patent Document 1, the concentration of Sc added to a ScAlN thin film is higher than 43 mol %.

However, as a result of examining the piezoelectric performance of the ScAlN thin film disclosed in Patent Document 1 by the present inventors, the piezoelectric performance that was anticipated from the theoretical calculation was not exhibited.

Therefore, the present invention has been made in consideration of the above-described problem, and an object of the present invention is to provide a ScAlN laminate having further improved piezoelectric performance.

Means for Solving the Problem

In order to achieve the aforementioned object, according to a certain viewpoint of the present invention, there is provided a ScAlN laminate including a substrate, an intermediate layer formed on the substrate and a ScAlN thin film formed on the intermediate layer, in which the nearest neighbor distance, which is the distance between atoms closest to each other in a lattice plane parallel to a surface of the intermediate layer, is shorter than the a-axis length of the ScAlN thin film.

Here, the ScAlN thin film may contain more than 43 mol % of Sc with respect to the total number of atoms of Al and Sc.

In addition, the ScAlN thin film may contain 59 mol % or more of Sc with respect to the total number of atoms of Al and Sc.

In addition, the ScAlN thin film may contain 81.5 mol % or less of Sc with respect to the total number of atoms of Al and Sc.

In addition, the ScAlN thin film may contain 67 mol % or less of Sc with respect to the total number of atoms of Al and Sc.

In addition, the nearest neighbor distance of the intermediate layer may be 3.34 Å or more and 3.71 Å or less.

In addition, the intermediate layer may include a <111> oriented film of YN.

In addition, the thickness of the ScAlN thin film may be 100 nm or less.

In addition, the ScAlN laminate may be used in any one or more selected from the group consisting of a transistor, an inverter, a ferroelectric memory and a MEMS device.

According to another viewpoint of the present invention, there is provided a manufacturing method of a ScAlN laminate including a step of forming an intermediate layer on a substrate and a step of forming a ScAlN thin film on the intermediate layer, in which the nearest neighbor distance, which is the distance between atoms closest to each other in a lattice plane parallel to a surface of the intermediate layer, is shorter than the a-axis length of the ScAlN thin film.

Effects of the Invention

According to the above-described viewpoints of the present invention, it is possible to provide a ScAlN laminate having further improved piezoelectric performance and a manufacturing method thereof.

BRIEF DESCRIPTION OF DRAWINGS

FIG. 5 and FIG. 6 are overlapped.

DESCRIPTION OF EMBODIMENTS

Hereinafter, a preferable embodiment of the present invention will be described in detail with reference to the following accompanying drawings. Numerical value-limiting ranges expressed using "to" mean ranges including numerical values before and after "to" as the lower limit value and the upper limit value. Numerical values expressed using "more than" or "less than" are not included in numerical ranges.

<1. Examination by Present Inventors>

First, examination by the present inventors will be described. As the phase morphologies of a ScAlN thin film, a Wurtzite phase and a rock salt phase are known. More of a more stable phase of these is considered to be present in the ScAlN thin film. Since the Wurtzite phase exhibits piezoelectricity, in a case where the Wurtzite phase is stably present in the ScAlN thin film, it can be said that the ScAlN thin film exhibits high piezoelectric performance. Therefore, the present inventors firstly confirmed which phase becomes stable by the addition of Sc.

Each phase can be said to become more stable as the formation enthalpy becomes lower. The formation enthalpy ΔH is indicated by the following mathematical formula (1). Here, a ScAlN thin film was considered to be directly formed on a certain substrate.

$$\Delta H = H(\mathrm{Sc}_l\mathrm{Al}_m\mathrm{N}_n) - l \cdot H_{Sc}^{HCP} - m \cdot H_m^{FCC} - n \cdot H_{\frac{1}{2}N_2}^{Gas} \quad (1)$$

l, m, n: Mole fractions of Sc, Al, N $H(\mathrm{Sc}_l\mathrm{Al}_m\mathrm{N}_n)$: Total energy of ScAlN of Wurtzite mineral phase of rock salt phase in each composition $$H_{Sc}^{HCP}$$

Total energy of Sc of HCP (hexagonal closest packed) structure $$H_{Al}^{FCC}$$

Total energy of Al of FCC (face-centered cubic) structure $$H_{\frac{1}{2}N_2}^{Gas}$$

Value obtained by dividing total energy of $N_2$ molecule by two

Figure 2:
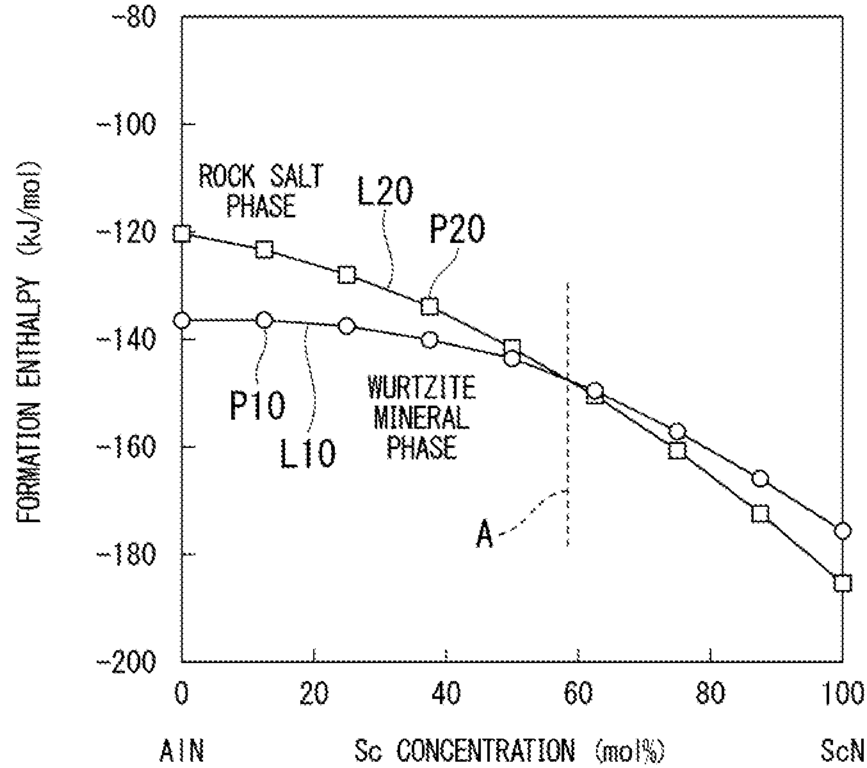
FIG. 2 is a graph showing the formation enthalpies (kJ/mol) of a Wurtzite phase and a rock salt phase in comparison.

The total energies in the mathematical formula (1) are automatically calculated by first-principles calculation (code: VASP). That is, in the present embodiment, theoretical calculation such as first-principles calculation refers to calculation that is automatically performed with an electric calculator capable of executing the theoretical calculation. The results are shown in FIG. 2. FIG. 2 shows a correlation between the molar concentration of Sc that has formed a solid solution in an AlN thin film (the molar concentration with respect to the total number of atoms of Sc and Al) and the formation enthalpy of a Wurtzite phase and a rock salt phase. Specifically, the horizontal axis of FIG. 2 indicates the molar concentration of Sc in the ScAlN thin film, and the vertical axis indicates the formation enthalpy (kJ/mol). A point P10 indicates the formation enthalpy of the Wurtzite phase in each composition (each molar concentration of Sc) of the ScAlN thin film, and a graph L10 is a graph obtained by linearly connecting the points P10. A point P20 indicates the formation enthalpy of the rock salt phase in each composition (each molar concentration of Sc) of the ScAlN thin film, and a graph L20 is a graph obtained by linearly connecting the points P20.

As is clear from FIG. 2, it can be said that, in the region where the molar concentration of Sc is lower than a broken line A, the Wurtzite phase is thermodynamically stable, and, in the region where the molar concentration of Sc is higher than the broken line A, the rock salt phase is thermodynamically stable. The broken line A indicates the intersection point between the graph L10 and the graph L20. Hereinafter, the value of the molar concentration of Sc that is indicated by the broken line A will also be referred to as the Sc solid solubility limit of the Wurtzite phase. That is, in the region where the molar concentration of Sc is lower than a broken line A, more of the Wurtzite phase is present in the ScAlN thin film, and, in the region where the molar concentration of Sc is higher than the broken line A, the rock salt phase is present much in the ScAlN thin film.

Figure 3:
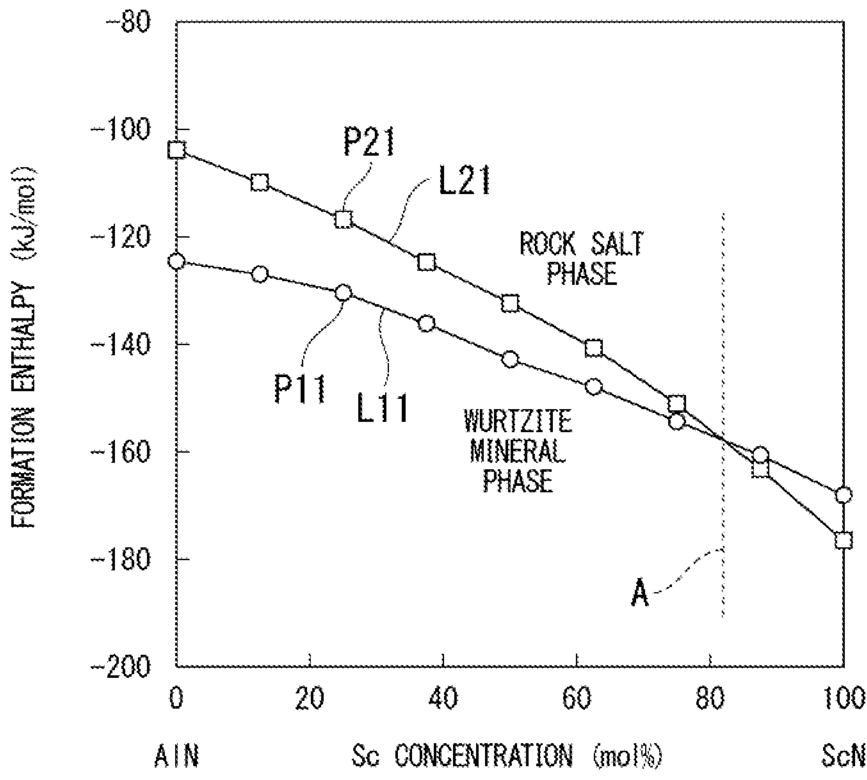
FIG. 3 is a graph showing the formation enthalpies (kJ/mol) of the Wurtzite phase and the rock salt phase in comparison.

Therefore, the present inventors considered that, if it is possible to shift the position of the broken line A toward the higher Sc concentration side as shown in FIG. 3, it is possible to make the Wurtzite phase be stably present while Sc is made to form a solid solution in an AlN thin film at a high concentration. This makes it possible to improve the piezoelectric performance of the ScAlN thin film. The definitions of the horizontal axis and the vertical axis of FIG. 3 are the same as in FIG. 2. A point P11 indicates the formation enthalpy of the Wurtzite phase in each composition (each molar concentration of Sc) of the ScAlN thin film, and a graph L11 is a graph obtained by linearly connecting the points P11. A point P21 indicates the formation enthalpy of the rock salt phase in each composition (each molar concentration of Sc) of the ScAlN thin film, and a graph L21 is a graph obtained by linearly connecting the points P21.

The present inventors paid attention to an intermediate layer in order to shift the position of the broken line A toward the high Sc concentration side. That is, the intermediate layer is interposed between a substrate and the ScAlN thin film. In addition, this intermediate layer introduces strain energy into the ScAlN thin film. Therefore, if it is possible to make the rock salt phase relatively unstable with respect to the Wurtzite phase (increase the formation enthalpy), it is possible to shift the position of the broken line A toward the high Sc concentration side. A formation enthalpy $\Delta H_{thin\ film}$ in consideration of the strain energy is indicated by the following mathematical formula (2). A method for obtaining the formation enthalpy ΔH in the mathematical formula (2) is the same as in the mathematical formula (1).

[Math. 2]

$$\Delta H_{thin\ film} = \Delta H + E_{strain} \tag{2}$$

The strain energy $E_{strain}$ in the mathematical formula (2) is indicated by the following mathematical formulae (3) and (4). In the mathematical formulae (3) and (4), V is the molar volume (the volume that is occupied by atoms per mole) and automatically calculated by first-principles calculation. h is the film thickness of the ScAlN thin film, G is the rigidity of the ScAlN thin film, υ is Poisson's ratio, ε is strain, and $h_c$ is the critical film thickness (a film thickness at which misfit dislocations are introduced). Here, the misfit dislocation is a dislocation that is introduced into the ScAlN thin film due to the lattice misfit between the intermediate layer and the ScAlN thin film.

[Math. 3]

$$E_{strain} = \frac{GV}{2}\frac{1+\nu}{1-\nu}\varepsilon^2 \quad h < h_c \tag{3}$$

$$E_{strain} = \frac{V}{h}2G\frac{1+\nu}{1-\nu}\varepsilon^2 h_c\left(1+\ln\left(\frac{h}{h_c}\right)\right) \quad h \geqq h_c \tag{4}$$

The rigidity is indicated by the following mathematical formulae (5) to (10). In the mathematical formula (6), BV is the bulk modulus (Voigt notation) of the ScAlN thin film. In addition, $C_{ij}$ (i, j: natural numbers in the mathematical formulae (6) to (10)) is the elastic modulus tensor and automatically calculated by first-principles calculation.

[Math. 4]

$$G = (G_R + G_V)/2 \tag{5}$$

$$G_R = 5/2\left[C^2 C_{44} C_{66}\right]/\left[3B_V C_{44} C_{66} + C^2(C_{44} + C_{66})\right] \tag{6}$$

$$G_V = 1/30(M + 12C_{44} + 12C_{66}) \tag{7}$$

$$C^2 = (C_{11} + C_{12})C_{33} - 2C_{13}^2 \tag{8}$$

$$M = C_{11} + C_{12} + 2C_{33} - 4C_{13} \tag{9}$$

$$B_V = 1/9[2(C_{11} + C_{12}) + 4C_{13} + C_{33}] \tag{10}$$

Poisson's ratio is indicated by the following mathematical formulae (11) to (13). B in the mathematical formula (11) is the bulk modulus, BR in the mathematical formula (12) is the bulk modulus (Reuss notation) of the ScAlN thin film. G, BV, $C^2$ and M in the mathematical formulae (11) to (13) are indicated by the following mathematical formulae (5) to (10).

[Math. 5]

$$\nu = (3B - 2G)/(6B + 2G) \tag{11}$$

$$B = (B_R + B_V)/2 \tag{12}$$

$$B_R = C^2/M \tag{13}$$

The strain ε is a lattice misfit between the intermediate layer and the ScAlN thin film and indicated by the following mathematical formula (14). In the mathematical formula (14), a is the lattice constant (a-axis length) of the ScAlN thin film in an a axis and automatically calculated by first-principles calculation. $a_0$ is the nearest neighbor distance (which will be described below) of the intermediate layer and has a value that varies with a substance that configures the intermediate layer. For example, in a case where a <111> oriented film of YN is used as the intermediate layer, $a_0$ becomes 3.46 Å.

[Math. 6]

$$\varepsilon = (a - a_0)/a_0 \tag{14}$$

The critical film thickness is indicated by the following mathematical formula (15). In the mathematical formula (15), & is strain, and v is Poisson's ratio, which are obtained by the above-described mathematical formulae. b is the Burgers vector. The Burgers vector of the Wurtzite phase is indicated by the following mathematical formula (16), and the Burgers vector of the rock salt phase is indicated by the following mathematical formula (17). In the following mathematical formulae (16) and (17), a is the lattice constant (a-axis length) in an a axis and automatically calculated by first-principles calculation. In the following mathematical formula (16), c is the lattice constant in a c axis and automatically calculated by first-principles calculation.

[Math. 7]

$$h_c = \frac{b}{4\pi\varepsilon(1+\nu)}\left(\ln\frac{h_c}{b} + 1\right) \tag{15}$$

$$b = \sqrt{a^2 + c^2} \tag{16}$$

$$b = \frac{\sqrt{2}}{2}a \tag{17}$$

According to the above-described mathematical formulae (2) to (17), the formation enthalpy $\Delta H_{thin\ film}$ in consideration of the strain energy depends on the interatomic distance of the intermediate layer. Therefore, it is conceivable that, when the interatomic distance of the intermediate layer is appropriately determined, it is possible to make the rock salt phase relatively unstable with respect to the Wurtzite phase, and it is possible to shift the position of the broken line A in FIG. 2 toward the high Sc concentration side. Therefore, the present inventors intensively examined the interatomic distance of the intermediate layer. As a result, it was ascertained that, in a case where the nearest neighbor distance, which is the distance between atoms closest to each other in a lattice plane parallel to the surface of the intermediate layer, is shorter than the a-axis length of the ScAlN thin film, it is possible to shift the position of the broken line A toward the high Sc concentration side more than in a case where there is no intermediate layer (in the case of FIG. 2). The nearest neighbor distance is a value after the ScAlN thin film is laminated on the surface of the intermediate layer and a value that is obtained by first-principles calculation. That is, when the nearest neighbor distance of the intermediate layer is made shorter than the a-axis length of the ScAlN thin film, it is possible to produce a Wurtzite phase-type ScAlN thin film containing Sc at a high concentration. An example of a substance that satisfies such a requirement of the nearest neighbor distance is the <111> oriented film of YN.

<2. Regarding Nearest Neighbor Distance>

Figure 5:
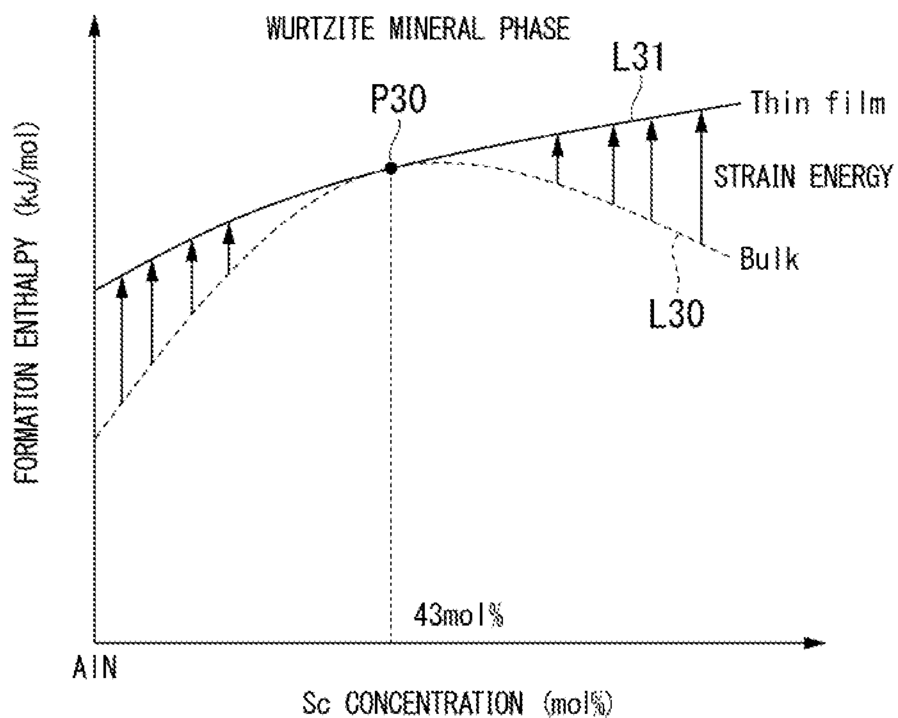
FIG. 5 is a graph showing the formation enthalpy (kJ/mol) of a Wurtzite phase-type ScAlN thin film and the formation enthalpy (kJ/mol) of a bulk body in comparison.

The present inventors further examined the nearest neighbor distance. The horizontal axis of FIG. 5 is the molar concentration of Sc (a molar concentration with respect to the total number of atoms of Al and Sc), and the vertical axis indicates the formation enthalpy. A graph L30 schematically shows a correlation between the molar concentration of Sc and the formation enthalpy of a ScAlN bulk body. Here, the ScAlN bulk body is almost the same meaning as the ScAlN thin film with no intermediate laver. A graph L31 schematically shows a correlation between the molar concentration of Sc and the formation enthalpy of the ScAlN thin film. The ScAlN thin film and the ScAlN bulk body were both a Wurtzite phase, and the intermediate layer of the ScAlN thin film was made of a substance in which the nearest neighbor distance was 3.34 Å. The film thickness of the ScAlN thin film was set to 5 nm. As shown in FIG. 5, the graphs L30 and L31 intersect each other at a point P30. The molar concentration of Sc corresponding to the point P30 is 43 mol %. That is, in a case where the molar concentration of Sc reaches 43 mol %, the formation enthalpy of the ScAlN bulk body and the formation enthalpy of the ScAlN thin film match each other. In other words, the formation enthalpy becomes fixed. In this case, strain energy is not generated in the ScAlN thin film. This means that the a-axis length of the ScAlN thin film and the nearest neighbor distance of the intermediate layer match each other. In a case where the molar concentration of Sc is different from 43 mol %, since the a-axis length of the ScAlN thin film and the nearest neighbor distance of the intermediate layer do not match each other, strain energy is generated in the ScAlN thin film, and the formation enthalpy increases. Therefore, the formation enthalpy of the ScAlN bulk body and the formation enthalpy of the ScAlN thin film do not match each other. Hereinafter, a point where the formation enthalpy of the ScAlN bulk body and the formation enthalpy of the ScAlN thin film match each other will also be referred to as "fixed point." The point P30 is an example of the fixed point.

Figure 6:
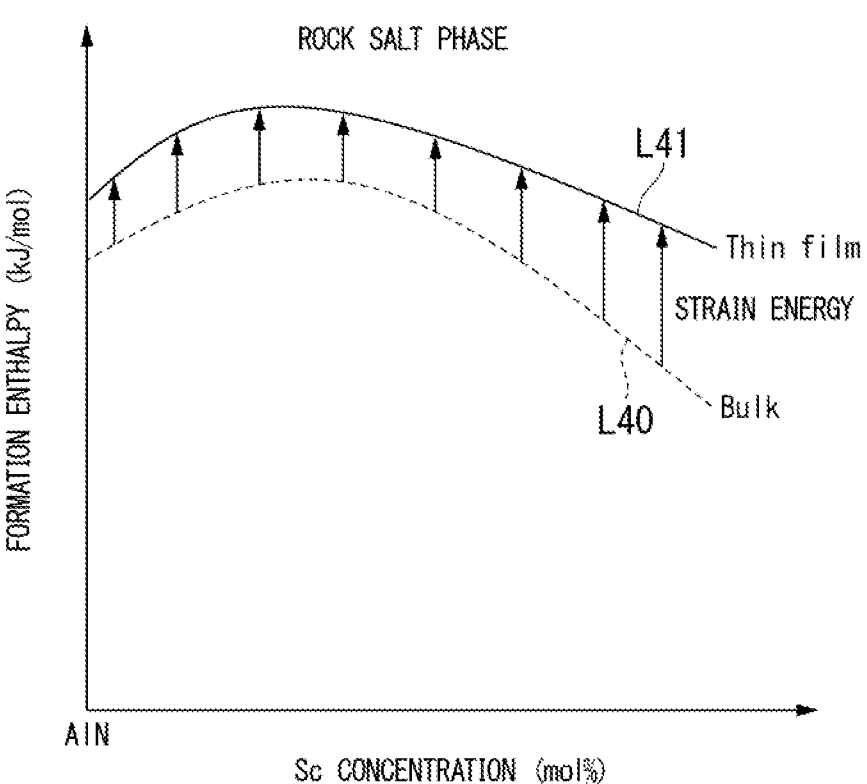
FIG. 6 is a graph showing the formation enthalpy (kJ/mol) of a rock salt phase-type ScAlN thin film and the formation enthalpy (kJ/mol) of a bulk body in comparison.

The horizontal axis of FIG. 6 is the molar concentration of Sc (a molar concentration with respect to the total number of atoms of Al and Sc), and the vertical axis indicates the formation enthalpy. A graph L40 schematically shows a correlation between the molar concentration of Sc and the formation enthalpy of a ScAlN bulk body. A graph L41 schematically shows a correlation between the molar concentration of Sc and the formation enthalpy of the ScAlN thin film. The ScAlN thin film and the ScAlN bulk body were both a rock salt phase, and the intermediate layer of the ScAlN thin film was made of a substance in which the nearest neighbor distance was 3.34 Å. The film thickness of the ScAlN thin film was set to 5 nm. As shown in FIG. 6, the graphs L40 and L41 do not intersect each other. That is, the a-axis length of the ScAlN thin film and the nearest neighbor distance of the intermediate layer do not match each other in all Sc concentrations. Therefore, strain energy is generated in the ScAlN thin film regardless of the Sc concentration.

Figure 7:
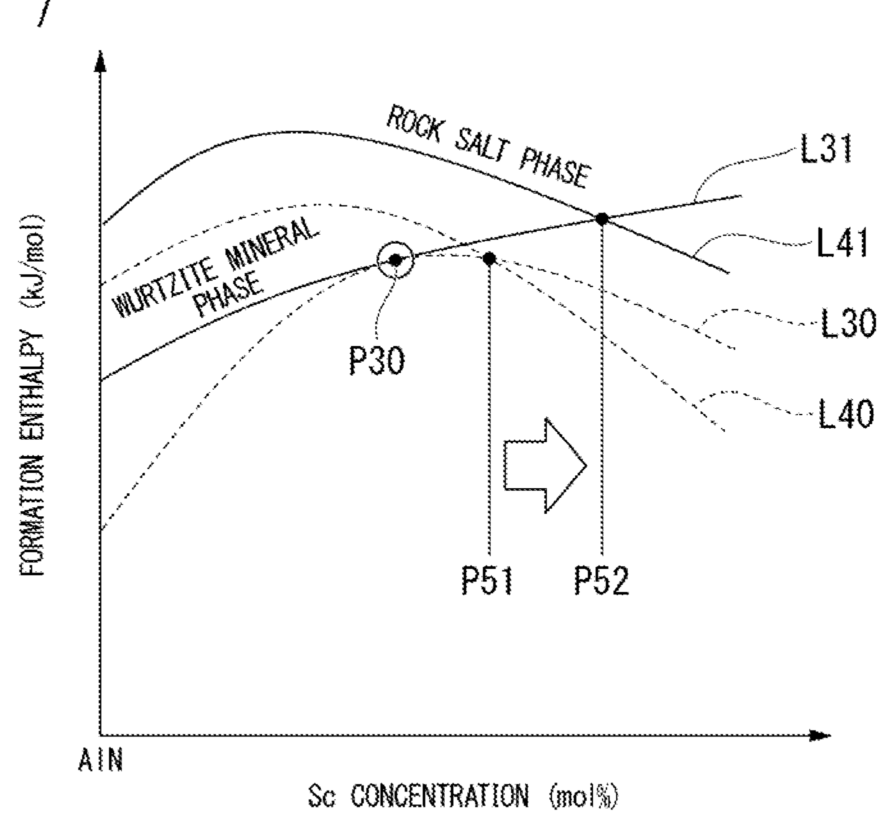
FIG. 7 is a graph where

FIG. 7 is a view where FIG. 5 and FIG. 6 are overlapped. In a case where the graphs of the ScAlN bulk bodies are compared with each other, the Wurtzite phase becomes stable in a case where the Sc concentration becomes lower than that at a point P51 (Sc solid solubility limit). The molar concentration of Sc at which the point P51 appears is 59 mol %. On the other hand, in a case where the graphs of the ScAlN thin films are compared with each other, the Wurtzite phase becomes stable in a case where the Sc concentration becomes lower than that at a point P52 (Sc solid solubility limit). The molar concentration of Sc at which the point P52 appears is higher than that for the point P51 and reaches 67 mol %. Therefore, it is possible to produce a Wurtzite phase-type ScAlN thin film containing a higher concentration of Sc.

A phenomenon as described above is considered to occur in a case where the nearest neighbor distance of the intermediate layer is made shorter than the a-axis length of the ScAlN thin film. That is, in a case where the nearest neighbor distance of the intermediate layer is made shorter than the a-axis length of the ScAlN thin film, it is considered that a fixed point is present and it is possible to shift the Sc solid solubility limit of the ScAlN thin film toward the high concentration side more than the Sc solid solubility limit of the bulk body. In addition, the width of the Sc solid solubility limit shifted is considered to become particularly large in a case where the molar concentration of Sc becomes higher than 43 mol %.

Figure 8:
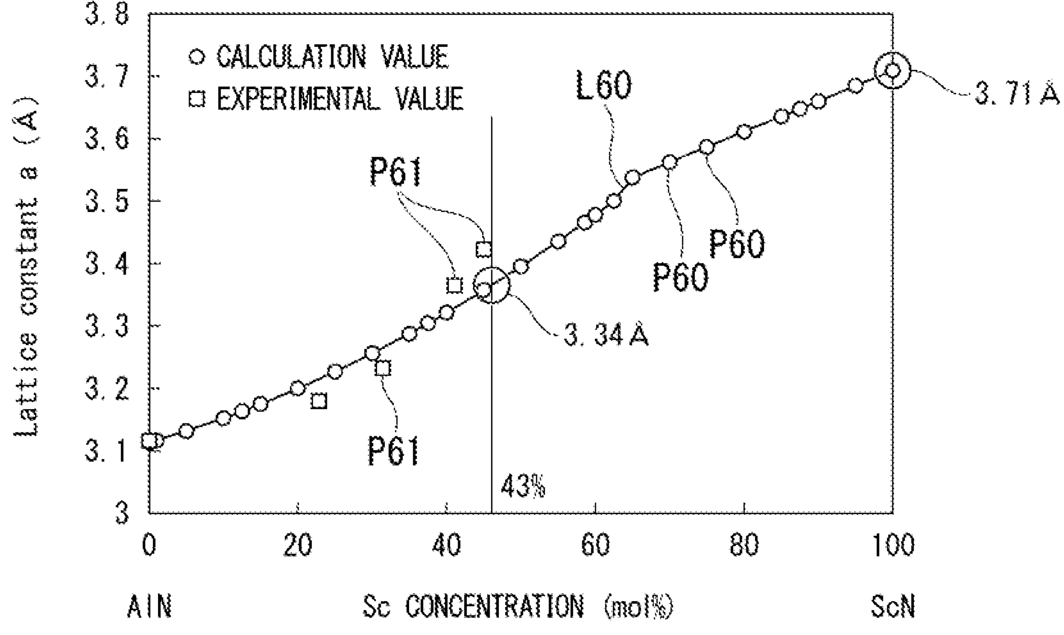
FIG. 8 is a graph showing a correlation between the molar concentration (mol %) of Sc and the a-axis length (A) of a ScAlN thin film.

The horizontal axis of FIG. 8 is the molar concentration (mol %) of Sc. and the vertical axis indicates the a-axis length (A) of the ScAlN thin film. Points P60 indicate a correlation between the molar concentration of Sc and the a-axis length of the ScAlN thin film obtained by first-principles calculation, and a graph L60 is a graph obtained by linearly connecting the points P60. Points P61 indicate a correlation between the molar concentration of Sc and the a-axis length of the ScAlN thin film obtained by an experiment (experimental value). Here, the experimental value is calculated from an electron diffraction pattern of a thin film produced by magnetron sputtering. As shown in FIG. 8, the first-principles calculation value and the experimental value exhibit a favorable correlation.

When this graph is referred to, in a case where the molar concentration of Sc becomes 43 mol %, the a-axis length of the ScAlN thin film becomes 3.34 Å, and, in a case where the molar concentration of Sc becomes 100 mol %, the a-axis length of the ScAlN thin film (ScN thin film) becomes 3.71 Å. Therefore, in a case where the molar concentration of Sc in the ScAlN thin film becomes higher than 43 mol %, the nearest neighbor distance of the intermediate layer reaches 3.34 Å or more and 3.71 Å or less, which makes it preferable to determine the material of the intermediate layer so that the nearest neighbor distance becomes shorter than the a-axis length of the ScAlN thin film.

Figure 9:
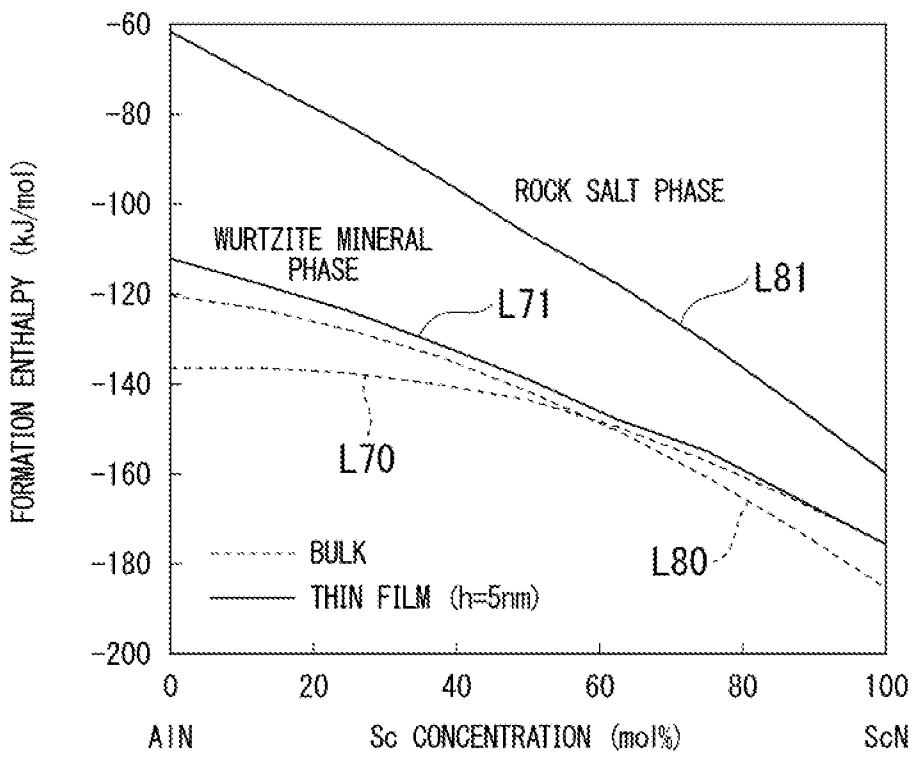
FIG. 9 is a graph showing the formation enthalpies (kJ/mol) of the Wurtzite phase and the rock salt phase in comparison in a case where the nearest neighbor distance of an intermediate layer reaches 3.71 Å.

The horizontal axis of FIG. 9 is the molar concentration (mol %) of Sc, and the vertical axis indicates the formation enthalpy (kJ/mol) of the Wurtzite phase or the rock salt phase. A graph L70 indicates a correlation between the molar concentration of Sc and the formation enthalpy of the ScAlN bulk body. A graph L71 indicates a correlation between the molar concentration of Sc and the formation enthalpy of the ScAlN thin film. The ScAlN thin film and the ScAlN bulk body in the graphs L70 and L71 are both a Wurtzite phase, and the nearest neighbor distance of the intermediate layer of the ScAlN thin film is 3.71 Å. In addition, the film thickness of the ScAlN thin film is 5 nm.

A graph L80 indicates a correlation between the molar concentration of Sc and the formation enthalpy of the ScAlN bulk body. A graph L81 indicates a correlation between the molar concentration of Sc and the formation enthalpy of the ScAlN thin film. The ScAlN thin film and the ScAlN bulk body in the graphs L80 and L81 are both a rock salt phase, and the nearest neighbor distance of the intermediate layer of the ScAlN thin film is 3.71 Å. In addition, the film thickness of the ScAlN thin film is 5 nm.

As is clear from FIG. 9, the formation enthalpy of the Wurtzite phase-type ScAlN thin film becomes lower than the formation enthalpy of the rock salt phase-type ScAlN thin film regardless of the molar concentration of Sc. In contrast, when attention is paid to the bulk body, the Sc solid solubility limit of Sc with respect to a Wurtzite phase-type ScAlN bulk body is 59 mol %. That is, the Wurtzite phase-type ScAlN bulk body cannot be stably present unless the molar concentration of Sc is 59 mol % or lower. Therefore, the formation of an intermediate layer where the nearest neighbor distance reaches 3.71 Å makes it possible to make the Wurtzite phase be stably present while a solid solution of Sc is formed at a high concentration in the ScAlN thin film.

Figure 10:
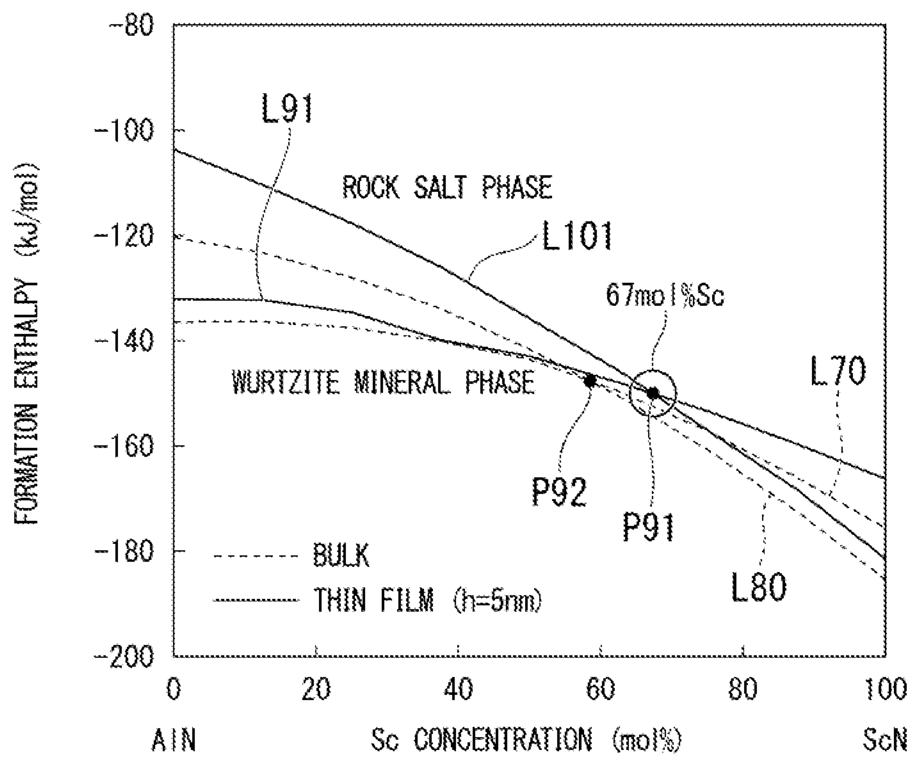
FIG. 10 is a graph showing the formation enthalpies (kJ/mol) of the Wurtzite phase and the rock salt phase in comparison in a case where the nearest neighbor distance of the intermediate layer reaches 3.34 Å.

The horizontal axis of FIG. 10 is the molar concentration (mol %) of Sc. and the vertical axis indicates the formation enthalpy (kJ/mol) of the Wurtzite phase or the rock salt phase. The graph L70 indicates the correlation between the molar concentration of Sc and the formation enthalpy of the ScAlN bulk body. A graph L91 indicates a correlation between the molar concentration of Sc and the formation enthalpy of the ScAlN thin film. The ScAlN thin film and the ScAlN bulk body in the graphs L70 and L91 are both a Wurtzite phase, and the nearest neighbor distance of the intermediate layer of the ScAlN thin film is 3.34 Å. In addition, the film thickness of the ScAlN thin film is 5 nm.

The graph L80 indicates the correlation between the molar concentration of Sc and the formation enthalpy of the ScAlN bulk body. A graph L101 indicates a correlation between the molar concentration of Sc and the formation enthalpy of the ScAlN thin film. The ScAlN thin film and the ScAlN bulk body in the graphs L80 and L101 are both a rock salt phase, and the nearest neighbor distance of the intermediate layer of the ScAlN thin film is 3.34 Å. In addition, the film thickness of the ScAlN thin film is 5 nm.

As is clear from FIG. 10, in a case where the nearest neighbor distance of the intermediate layer reaches 3.34 Å, the Sc solid solubility limit with respect to the Wurtzite phase-type ScAlN thin film reaches 67 mol % (point P91). In contrast, when attention is paid to the bulk body, the Sc solid solubility limit with respect to the Wurtzite phase-type ScAlN bulk body is 59 mol %. That is, the ScAlN bulk body cannot be stably present unless the molar concentration of Sc is 59 mol % (point P92) or lower. Therefore, the formation of an intermediate layer where the nearest neighbor distance reaches 3.34 Å makes it possible to make the Wurtzite phase be stably present while a solid solution of Sc is formed at a high concentration in the ScAlN thin film.

From what has been described above, it is found that, in a case where the film thickness of the ScAlN thin film is 5 nm, it is preferable that the nearest neighbor distance of the intermediate layer is 3.34 Å or more and 3.71 Å or less in a case where the molar concentration of Sc becomes higher than 43 mol %.

Figure 11:
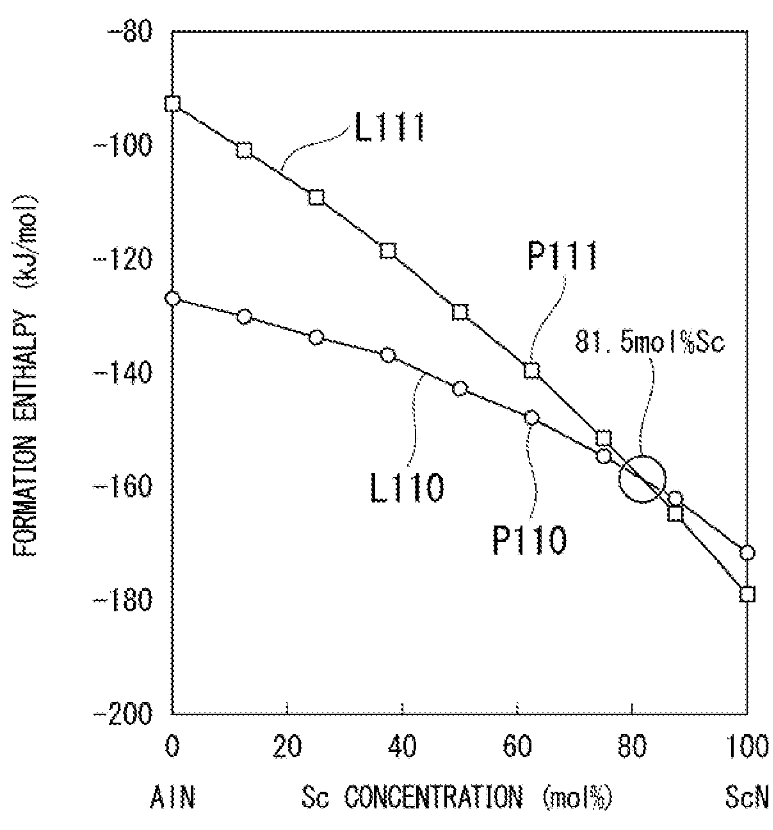
FIG. 11 is a graph showing the formation enthalpies (kJ/mol) of the Wurtzite phase and the rock salt phase in comparison in a case where a <111> oriented film of YN is used as the intermediate layer.

The nearest neighbor distance of the <111> oriented film of YN is 3.46 Å and satisfies the requirement of 3.34 Å or more and 3.71 Å or less. FIG. 11 shows a correlation between the molar concentration of Sc and the formation enthalpy of the Wurtzite phase or the rock salt phase-type ScAlN thin film when the <111> oriented film of YN is used as the intermediate layer.

More specifically, the horizontal axis of FIG. 11 indicates the molar concentration (mol %) of Sc, and the vertical axis indicates the formation enthalpy (kJ/mol) of the Wurtzite phase or the rock salt phase-type ScAlN thin film. Points P110 indicate a correlation between the molar concentration of Sc and the formation enthalpy of the Wurtzite phase-type ScAlN thin film. A graph L110 is a graph obtained by linearly connecting the points P110. Points P111 indicate a correlation between the molar concentration of Sc and the formation enthalpy of the rock salt phase-type ScAlN thin film. A graph L111 is a graph obtained by linearly connecting the points P111. As is clear from FIG. 11, the use of the <111> oriented film of YN is used as the intermediate layer makes it possible to increase the Sc solid solubility limit with respect to the ScAlN thin film up to 81.5 mol %. Based on such a finding, the present inventors obtained an idea of a ScAlN laminate according to the present embodiment. Hereinafter, the ScAlN laminate according to the present embodiment will be described.

<3. Configuration of ScAlN Laminate>

Figure 1:
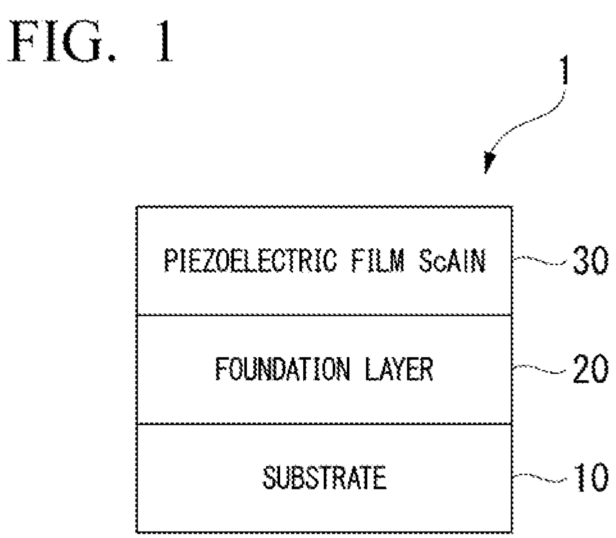
FIG. 1 is a side view showing the schematic configuration of a ScAlN laminate according to one embodiment of the present invention.

Next, the configuration of a ScAlN laminate 1 according to the present embodiment will be described based on FIG. 1. The ScAlN laminate 1 includes a substrate 10, an intermediate layer 20 and a ScAlN thin film (piezoelectric film) 30.

The kind of the substrate 10 is not particularly questioned and may be any substrate as long as the intermediate layer 20 and the ScAlN thin film 30, which will be described below, can be laminated thereon. The substrate 10 may be composed of, for example, silicon, a conductive metal, sapphire, SiC, glass or an organic material.

The intermediate layer 20 makes the rock salt phase in the ScAlN thin film be relatively unstable with respect to the Wurtzite phase by introducing strain energy into the ScAlN thin film 30 as described above. The nearest neighbor distance of the intermediate layer 20 is shorter than the a-axis length of the ScAlN thin film. For example, in a case where the molar concentration of Sc in the ScAlN thin film becomes higher than 43 mol %, the nearest neighbor distance of the intermediate layer 20 reaches 3.34 Å or more and 3.71 Å or less, and the nearest neighbor distance of the intermediate layer 20 becomes shorter than the a-axis length of the ScAlN thin film. The a-axis length of the ScAlN thin film varies with the molar concentration of Sc in the ScAlN thin film. Therefore, an a-axis length corresponding the molar concentration of the ScAlN thin film is obtained by first-principles calculation, and (a material of) an intermediate layer in which the nearest neighbor distance becomes shorter than the a-axis length needs to be selected. The intermediate layer 20 is formed on the substrate 10 by, for example, sputtering or the like. The intermediate layer 20 may be, for example, a <111> oriented film of YN. In addition, the intermediate layer 20 may be a multilayer structure. In this case, at least the nearest neighbor distance of a layer that comes into contact with the ScAlN thin film 30 becomes shorter than the a-axis length of the ScAlN thin film. For example, the intermediate layer 20 may be configured as a multilayer structure, and the layer that comes into contact with the ScAlN thin film 30 may be configured with a <111> oriented film of YN.

The ScAlN thin film 30 is an AlN thin film in which a solid solution of Sc has been formed. The ScAlN thin film 30 may be a single layer or a plurality of layers of ScAlN thin films having different polarization directions. Here, in the ScAlN thin film, a solid solution of Sc has been formed to an extent of the Sc solid solubility limit of the Wurtzite phase or less. In addition, the intermediate layer 20 makes the Sc solid solubility limit of the Wurtzite phase higher than that in a case where the intermediate layer 20 is not present. Therefore, the ScAlN thin film 30 exhibits high piezoelectric performance. The molar concentration of Sc in the ScAlN thin film is not particularly limited, but the lower limit value may be more than 43 mol % or may be 59 mol % or more. 59 mol % is the Sc solid solubility limit in the ScAlN bulk body: however, in the present embodiment. 59 mol % or more of Sc can be made to form a solid solution in the AlN thin film. The upper limit value may be 81.5 mol % or less or may be 67 mol % or less. In a case where a <111> oriented film of YN is selected as the intermediate layer, the Sc solid solubility limit reaches 81.5 mol %, and thus a maximum of 81.5 mol % of Sc is capable of forming a solid solution in the AlN thin film. 67 mol % is a solid solubility limit when the nearest neighbor distance of the intermediate layer 20 reaches 3.34 Å.

Here, as indicated by the mathematical formulae (3) and (4), strain energy that is introduced into the ScAlN thin film 30 is also affected by the film thickness (h) of the ScAlN thin film 30. As a result of examining the film thickness by the present inventors, it was ascertained that, in a case where the thickness of the ScAlN thin film reaches 100 nm or less, the Sc solid solubility limit of the Wurtzite phase becomes particularly high. The film thickness is more preferably 10 nm or less and still more preferably 5 nm or less. The lower limit value of the film thickness is not particularly limited, but is preferably more than 0 nm. A variation of the strain energy due to the film thickness will be described based on FIG. 4.

Figure 4:
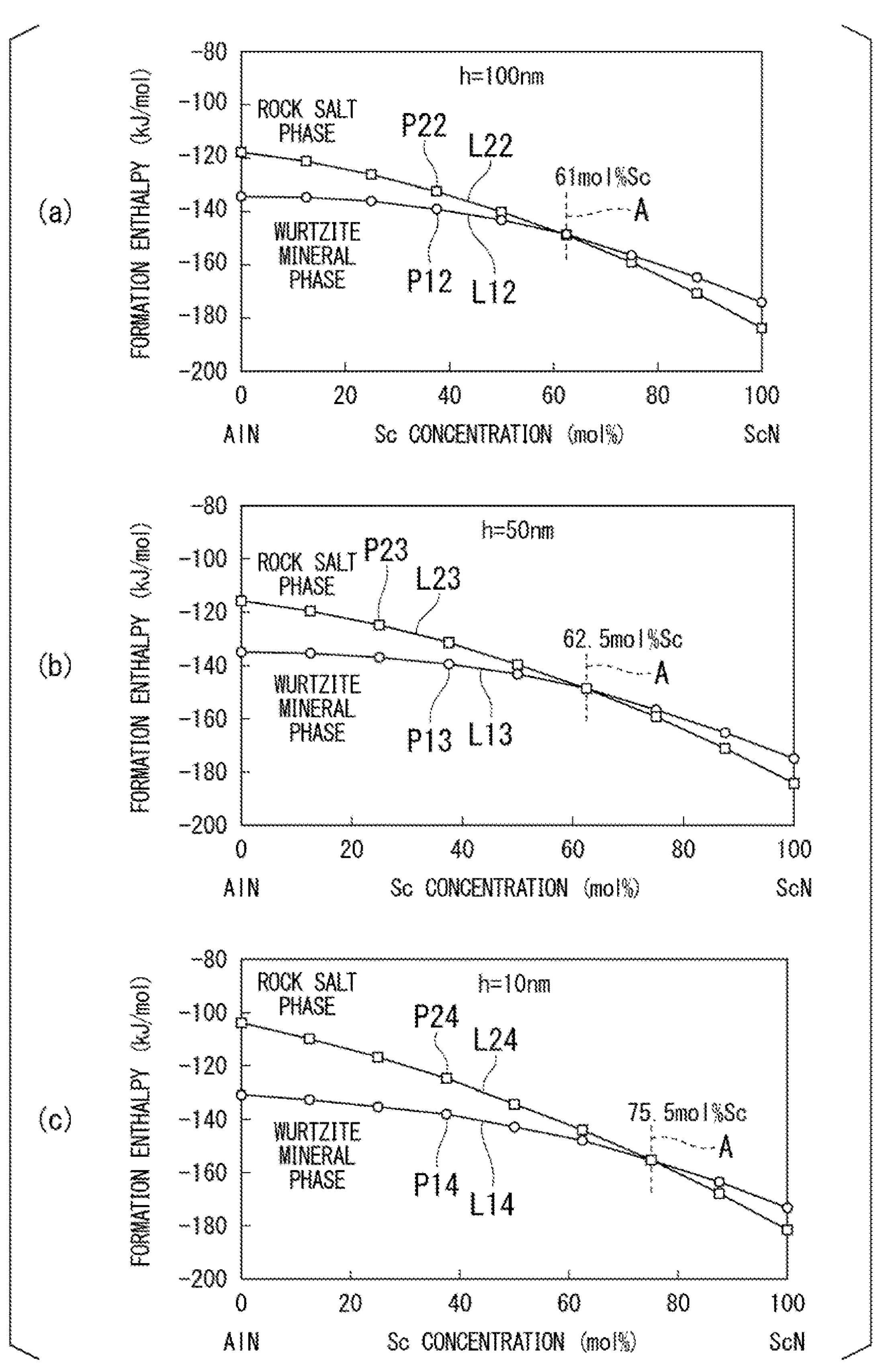
FIG. 4 is a graph showing the formation enthalpies (kJ/mol) of the Wurtzite phase and the rock salt phase in comparison.

FIGS. 4(*a*) to 4(*c*) each show a correlation between the molar concentration of Sc that has formed a solid solution in the ScAlN thin film (the molar concentration with respect to the total number of atoms of Sc and Al) and the formation enthalpy of the Wurtzite phase and the rock salt phase when the film thickness reaches 100 nm, 50 nm or 10 nm. An example of a case where the film thickness of the intermediate layer 20 reaches 5 nm is shown in FIG. 11. A <111> oriented film of YN (nearest neighbor distance $a_0$=3.46 Å) was used as the intermediate layer 20. The definitions of the vertical axis and the horizontal axis are the same as those in FIG. 2. A point P12 indicates the formation enthalpy of the Wurtzite phase in each composition (each molar concentration of Sc) of the ScAlN thin film having a film thickness of 100 nm, and a graph L12 is a graph obtained by linearly connecting the points P12. A point P22 indicates the formation enthalpy of the rock salt phase in each composition (each molar concentration of Sc) of the ScAlN thin film having a film thickness of 100 nm, and a graph L22 is a graph obtained by linearly connecting the points P22. As shown in FIG. 4(*a*), the Sc solid solubility limit of the Wurtzite phase at a film thickness of 100 nm reaches 61 mol %.

A point P13 indicates the formation enthalpy of the Wurtzite phase in each composition (each molar concentration of Sc) of the ScAlN thin film having a film thickness of 50 nm, and a graph L13 is a graph obtained by linearly connecting the points P13. A point P23 indicates the formation enthalpy of the rock salt phase in each composition (each molar concentration of Sc) of the ScAlN thin film having a film thickness of 50) nm, and a graph L23 is a graph obtained by linearly connecting the points P23. As shown in FIG. 4(*b*), the Sc solid solubility limit of the Wurtzite phase at a film thickness of 50) nm reaches 62.5 mol %.

A point P14 indicates the formation enthalpy of the Wurtzite phase in each composition (each molar concentration of Sc) of the ScAlN thin film having a film thickness of 10 nm, and a graph L14 is a graph obtained by linearly connecting the points P14. A point P24 indicates the formation enthalpy of the rock salt phase in each composition (each molar concentration of Sc) of the ScAlN thin film having a film thickness of 10 nm, and a graph L24 is a graph obtained by linearly connecting the points P24. As shown in FIG. 4(*c*), the Sc solid solubility limit of the Wurtzite phase at a film thickness of 10 nm reaches 75.5 mol %.

Here, according to first-principles calculation, if the Wurtzite phase is stable when the molar concentration of Sc becomes approximately 70) mol %, the piezoelectric constant of the ScAlN thin film is maximized (approximately 100) pC/N). Therefore, the Wurtzite phase is preferably stable when the molar concentration of Sc becomes, for example, 59 to 81.5 mol %, and the film thickness is thus preferably 10 nm or less. This is because, when the film thickness is 10 nm or less, the Sc solid solubility limit of the Wurtzite phase exceeds 70) mol %.

Therefore, an example of a preferable aspect of the ScAlN laminate 1 is as described below: First, the intermediate layer 20 is composed of a <111> oriented film of YN. The film thickness of the ScAlN thin film 30 is 10 nm or less, and more than 43 mol %, preferably 59 to 81.5 mol % and more preferably 70) mol % of Sc has formed a solid solution. In this case, the ScAlN thin film 30 exhibits extremely high piezoelectric performance. It is needless to say that this is simply an example, and the ScAlN thin film 30 exhibits high piezoelectric performance as long as the requirement of the present embodiment is satisfied. Other examples of the intermediate layer include films for which Y, La, Ce, Pr, Nd, Gd, Tb, Dy, Ho, Er, Tm, Lu and Tl are used.

Furthermore, variations of the strain energy due to the film thickness when the nearest neighbor distance of the intermediate layer 20 is changed will be described based on FIGS. 12 and 13.

Figure 12:
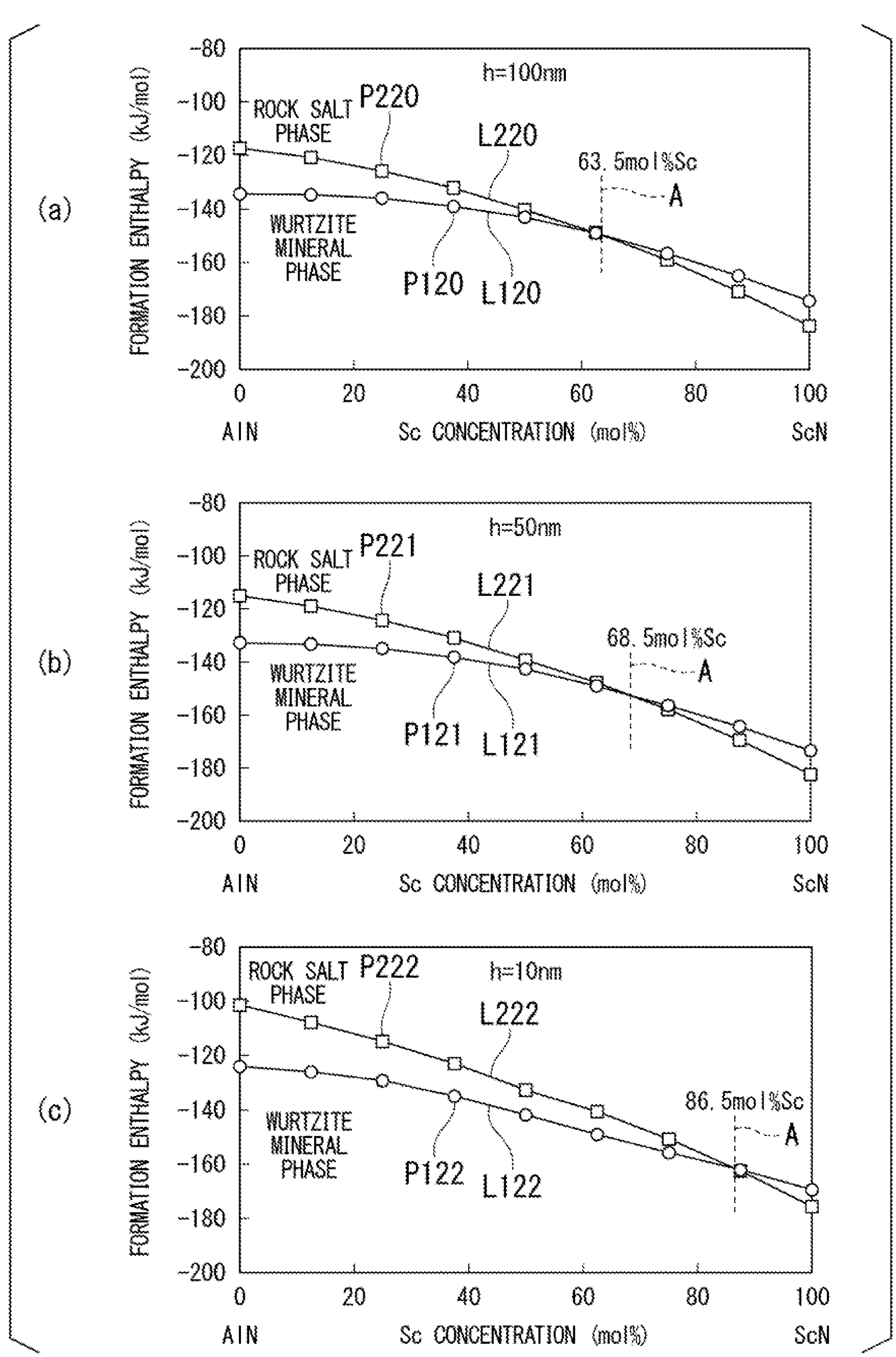
FIG. 12 is a graph showing the formation enthalpies (kJ/mol) of the Wurtzite phase and the rock salt phase in comparison when the nearest neighbor distance of the intermediate layer reaches 3.50 Å and the film thickness (h) of the ScAlN thin film is changed.

FIGS. 12(*a*) to 12(*c*) each show a correlation between the molar concentration of Sc that has formed a solid solution in the ScAlN thin film (the molar concentration with respect to the total number of atoms of Sc and Al) and the formation enthalpy of the Wurtzite phase and the rock salt phase when the nearest neighbor distance $a_0$ of the intermediate layer 20 is 3.50 Å and the film thickness reaches 100 nm, 50 nm or 10 nm. The definitions of the vertical axis and the horizontal axis are the same as those in FIG. 2. A point P120 indicates the formation enthalpy of the Wurtzite phase in each composition (each molar concentration of Sc) of the ScAlN thin film having a film thickness of 100 nm, and a graph L120 is a graph obtained by linearly connecting the points P120. A point P220 indicates the formation enthalpy of the rock salt phase in each composition (each molar concentration of Sc) of the ScAlN thin film having a film thickness of 100 nm, and a graph L220 is a graph obtained by linearly connecting the points P220. As shown in FIG. 12(*a*), the Sc solid solubility limit of the Wurtzite phase at a film thickness of 100 nm reaches 63.5 mol %.

A point P121 indicates the formation enthalpy of the Wurtzite phase in each composition (each molar concentration of Sc) of the ScAlN thin film having a film thickness of 50 nm, and a graph L121 is a graph obtained by linearly connecting the points P121. A point P221 indicates the formation enthalpy of the rock salt phase in each composition (each molar concentration of Sc) of the ScAlN thin film having a film thickness of 50 nm, and a graph L221 is a graph obtained by linearly connecting the points P221. As shown in FIG. 12(*b*), the Sc solid solubility limit of the Wurtzite phase at a film thickness of 50) nm reaches 68.5 mol %.

A point P122 indicates the formation enthalpy of the Wurtzite phase in each composition (each molar concentration of Sc) of the ScAlN thin film having a film thickness of 10 nm, and a graph L122 is a graph obtained by linearly connecting the points P122. A point P222 indicates the formation enthalpy of the rock salt phase in each composition (each molar concentration of Sc) of the ScAlN thin film having a film thickness of 10 nm, and a graph L222 is a graph obtained by linearly connecting the points P222. As shown in FIG. 12(*c*), the Sc solid solubility limit of the Wurtzite phase at a film thickness of 10) nm reaches 86.5 mol %.

Figure 13:
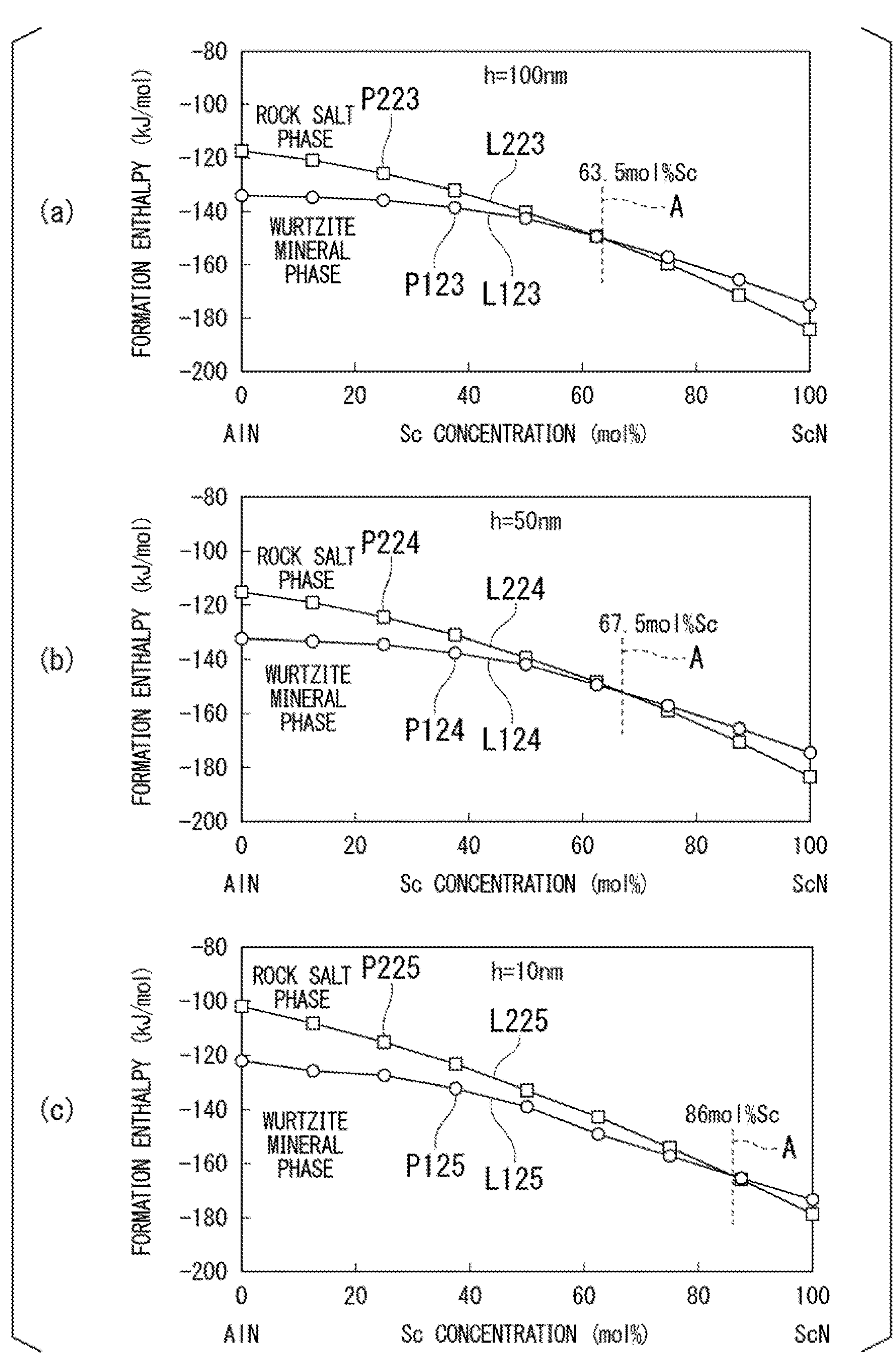
FIG. 13 is a graph showing the formation enthalpies (kJ/mol) of the Wurtzite phase and the rock salt phase in comparison when the nearest neighbor distance of the intermediate layer reaches 3.60 Å and the film thickness (h) of the ScAlN thin film is changed.

FIGS. 13(*a*) to 13(*c*) each show a correlation between the molar concentration of Sc that has formed a solid solution in the ScAlN thin film (the molar concentration with respect to the total number of atoms of Sc and Al) and the formation enthalpy of the Wurtzite phase and the rock salt phase when the nearest neighbor distance $a_0$ of the intermediate layer 20 is 3.60 Å and the film thickness reaches 100 nm. 50 nm or 10 nm. The definitions of the vertical axis and the horizontal axis are the same as those in FIG. 2. A point P123 indicates the formation enthalpy of the Wurtzite phase in each composition (each molar concentration of Sc) of the ScAlN thin film having a film thickness of 100 nm, and a graph L123 is a graph obtained by linearly connecting the points P123. A point P223 indicates the formation enthalpy of the rock salt phase in each composition (each molar concentration of Sc) of the ScAlN thin film having a film thickness of 100 nm, and a graph L223 is a graph obtained by linearly connecting the points P223. As shown in FIG. 13(*a*), the Sc solid solubility limit of the Wurtzite phase at a film thickness of 100 nm reaches 63.5 mol %.

A point P124 indicates the formation enthalpy of the Wurtzite phase in each composition (each molar concentration of Sc) of the ScAlN thin film having a film thickness of 50 nm, and a graph L124 is a graph obtained by linearly connecting the points P124. A point P224 indicates the formation enthalpy of the rock salt phase in each composition (each molar concentration of Sc) of the ScAlN thin film having a film thickness of 50 nm, and a graph L224 is a graph obtained by linearly connecting the points P224. As shown in FIG. 13(*b*), the Sc solid solubility limit of the Wurtzite phase at a film thickness of 50 nm reaches 67.5 mol %.

A point P125 indicates the formation enthalpy of the Wurtzite phase in each composition (each molar concentration of Sc) of the ScAlN thin film having a film thickness of 10 nm, and a graph L125 is a graph obtained by linearly connecting the points P125. A point P225 indicates the formation enthalpy of the rock salt phase in each composition (each molar concentration of Sc) of the ScAlN thin film having a film thickness of 10 nm, and a graph L225 is a graph obtained by linearly connecting the points P225. As shown in FIG. 13(*c*), the Sc solid solubility limit of the Wurtzite phase at a film thickness of 10) nm reaches 86 mol %.

As described above, it is found that, even in a case where the nearest neighbor distance $a_0$ of the intermediate layer 20 is 3.50 Å or 3.60 Å, as the film thickness (h) of the ScAlN thin film 30 becomes thinner, the Sc solid solubility limit amount of the Wurtzite phase becomes larger. When the film thickness of the ScAlN thin film is 10 nm or less, the Sc solid solubility limit of the Wurtzite phase exceeds 70) mol %. Therefore, the film thickness of the ScAlN thin film is preferably 10 nm or less.

<4. Manufacturing Method of ScAlN Laminate>

The manufacturing method is not particularly limited and may be any manufacturing method as long as the ScAlN laminate 1 having the above-described characteristics can be obtained by the manufacturing method. An example of the manufacturing method is a manufacturing method including a step of forming the intermediate layer 20 on the substrate 10 and a step of forming the ScAlN thin film 30 on the intermediate layer 20. The intermediate layer 20 and the ScAlN thin film 30 are formed by, for example, a sputtering method. Here, the molar concentration of Sc and the material of the intermediate layer 20 are selected so that the nearest neighbor distance of the intermediate layer 20 becomes shorter than the a-axis length of the ScAlN thin film 30.

<5. Application Example of ScAlN Laminate>

The ScAlN laminate 1 is applied to a variety of fields. For example, the ScAlN laminate 1 may be used in any one or more selected from the group consisting of a transistor, an inverter, a ferroelectric memory and a MEMS device (including a piezoelectric device). In addition, the ScAlN laminate 1 may also be used in a FBAR high-frequency filter for mobile communication, a piezoelectric sensor, an energy harvester, a MEMS microphone and a fingerprint authentication sensor.

Hitherto, the preferable embodiment of the present invention has been described in detail with reference to the accompanying drawings, but the present invention is not limited to such an example. It is clear that a person having ordinary skill in the technical field to which the invention pertains is able to obtain an idea of a variety of modification examples or correction examples within the scope of a technical concept described in the claims, and it is needless to say that such examples are also understood to be included in the technical scope of the present invention.

REFERENCE SIGNS LIST

1 ScAlN laminate
10 Substrate
20 Intermediate layer
30 ScAlN thin film

What is claimed is:

1. A ScAlN laminate comprising:
a substrate;
an intermediate layer formed on the substrate; and
a ScAlN thin film formed on the intermediate layer,
wherein a nearest neighbor distance, which is a distance between atoms closest to each other in a lattice plane parallel to a surface of the intermediate layer, is shorter than an a-axis length of the ScAlN thin film,
wherein the lattice plane parallel to a surface of the intermediate layer is in the outermost portion of the intermediate layer,
wherein the ScAlN thin film contains more than 43 mol % of Sc with respect to the total number of atoms of Al and Sc, and
wherein the nearest neighbor distance of the intermediate layer is 3.34 Å or more and 3.71 Å or less.

2. The ScAlN laminate according to claim 1, wherein the ScAlN thin film contains 59 mol % or more of Sc with respect to the total number of atoms of Al and Sc.

3. The ScAlN laminate according to claim 1, wherein the ScAlN thin film contains 81.5 mol % or less of Sc with respect to the total number of atoms of Al and Sc.

4. The ScAlN laminate according to claim 1, wherein the ScAlN thin film contains 67 mol % or less of Sc with respect to the total number of atoms of Al and Sc.

5. The ScAlN laminate according to claim 1, wherein the intermediate layer includes a <111> oriented film of YN.

6. The ScAlN laminate according to claim 1, wherein a thickness of the ScAlN thin film is 100 nm or less.

7. The ScAlN laminate according to claim 1, wherein the ScAlN laminate is used in any one or more selected from the group consisting of a transistor, an inverter, a ferroelectric memory and a MEMS device.

8. A manufacturing method of a ScAlN laminate comprising:

a step of forming an intermediate layer on a substrate; and a step of forming a ScAlN thin film on the intermediate layer, wherein a nearest neighbor distance, which is a distance between atoms closest to each other in a lattice plane parallel to a surface of the intermediate layer, is shorter than an a-axis length of the ScAlN thin film, wherein the lattice plane parallel to a surface of the intermediate layer is in the outermost portion of the intermediate layer, wherein the ScAlN thin film contains more than 43 mol % of Sc with respect to the total number of atoms of Al and Sc, and wherein the nearest neighbor distance of the intermediate layer is 3.34 Å or more and 3.71 Å or less.

9. The ScAlN laminate according to claim 2, wherein the ScAlN thin film contains 81.5 mol % or less of Sc with respect to the total number of atoms of Al and Sc.

10. The ScAlN laminate according to claim 2, wherein the ScAlN thin film contains 67 mol % or less of Sc with respect to the total number of atoms of Al and Sc.

* * * * *